United States Patent [19]

Murase et al.

[11] Patent Number: 4,979,172

[45] Date of Patent: Dec. 18, 1990

[54] MICROCOMPUTER

[75] Inventors: Kazuyuki Murase, Kawasaki; Naoyasu Tasaka, Yokohama, both of Japan

[73] Assignee: Kabushiki Kaisha Toshiba, Kawasaki, Japan

[21] Appl. No.: 289,803

[22] Filed: Dec. 27, 1988

[30] Foreign Application Priority Data

Dec. 26, 1987 [JP] Japan .............................. 62-330436

[51] Int. Cl.[5] .............................................. G06F 11/00
[52] U.S. Cl. .................................................. 371/16.1
[58] Field of Search .......................... 371/16.1, 16.4; 364/200 MS File, 900 MS File

[56] References Cited

U.S. PATENT DOCUMENTS

| | | | |
|---|---|---|---|
| 4,317,199 | 2/1982 | Winslow | 371/16.1 |
| 4,433,413 | 2/1984 | Fasang | 371/16.1 |
| 4,468,768 | 8/1984 | Sunkle et al. | 371/16.1 |
| 4,622,668 | 11/1986 | Dancker et al. | 371/16.1 |
| 4,641,308 | 2/1987 | Sacarisen et al. | 371/16.1 |
| 4,811,345 | 3/1989 | Johnson | 371/16.1 |

*Primary Examiner*—Charles E. Atkinson
*Attorney, Agent, or Firm*—Foley & Lardner, Schwartz, Jeffery, Schwaab, Mack, Blumenthal & Evans

[57] ABSTRACT

A microcomputer incorporates an EPROM for storing programs and data which a CPU executes, and includes, as operating modes, a microcomputer mode for operating as a microcomputer, a test mode for testing the operation of the CPU and an EPROM mode for writing in and reading from the EPROM. A test terminal of the microcomputer is used for mode switching control, i.e., used as a power supply testing/programming terminal. By the logic level of this terminal, switching between the microcomputer mode and the test mode is performed, and a programming voltage is also supplied. By a control terminal, which is another terminal, switching between the test mode and the EPROM mode is performed.

3 Claims, 1 Drawing Sheet

MICROCOMPUTER

BACKGROUND OF THE INVENTION

1. Field of the Art

This invention relates to a microcomputer, and more particularly to a one-chip microcomputer incorporating an EPROM for storing programs and data which a CPU executes.

2. Prior Art

In general, a one-chip MCU (Micro-Computer Unit) which incorporates an EPROM (Electrically Programmable Read Only Memory) as well as a CPU (Central Processing Unit), has a microcomputer mode which operates as a microcomputer, an EPROM mode which writes in and reads from the EPROM and a test mode which tests the CPU. Each of these modes is determined by a state of each of terminals of I/O (input/output) port, clock, reset, other control input signals, or the like, when power supply is applied, or reset is released.

The mode generally used by the user is the microcomputer mode. The switching between the microcomputer mode, the EPROM mode and the test mode is determined by a state of each of the above-described terminals. Hence, the user must design circuitry taking into consideration the state of each terminal so that an undesired mode is not obtained when power is input, or power is released or cutoff. Thus, there are problems when interfacing with peripheral circuits.

Terminal conditions can be uniformly fixed when the EPROM mode is used. However, in order to operate the EPROM mode by the same specifications as those for a general purpose EPROM, and write in and read from the EPROM mode by a general purpose programmer, it is necessary to provide a power supply programming terminal $V_{pp}$, an address terminal, a data terminal and a control terminal. The power supply programming terminal $V_{pp}$ is used only when the EPROM mode is selected, and not used in the microcomputer mode and test mode.

Further, in a microcomputer incorporating a mask ROM, which has the same functions as a microcomputer incorporating an EPROM, the power supply programming terminal $V_{pp}$ is unnecessary too. However, considering compatibility of both the microcomputers, it is necessary, in the microcomputer incorporating a mask ROM, that a terminal corresponding to the power supply programming terminal $V_{pp}$ of the microcomputer incorporating an EPROM having the same functions is not used, i.e., in the state of NC (no connection). Hence, there is a problem that the microcomputer incorporating a mask ROM must be originally designed with the number of terminals less by one terminal.

As described above, in the conventional microcomputer incorporating an EPROM, there is a problem that, when the user uses the microcomputer as the microcomputer mode, a restraint arises in the design of interface with peripheral circuits due to the setting of terminal conditions for switching modes. There is also a problem that a restraint arises in the use of terminals, because it is necessary to provide the power supply programming terminal $V_{pp}$ which is used only for the EPROM mode.

SUMMARY OF THE INVENTION

It is an object of the present invention to provide, taking into consideration the above-described circumstances, a microcomputer in which the user can design its interface with peripheral circuits without restrictions relating to the use of terminals when used in the microcomputer mode.

The above-described object is achieved by a microcomputer incorporating an EPROM for storing programs and data which a CPU executes. The microcomputer incorporates as operating modes, a microcomputer mode for operating as a microcomputer, a test mode for testing the operation of the CPU, and an EPROM mode for writing in and reading from the EPROM. The microcomputer comprising a power supply testing/programming terminal which uses in common a terminal function for switching the microcomputer mode and the test mode and a terminal function for applying a program voltage for writing in the EPROM, and a control terminal for switching the test mode and the EPROM mode. The microcomputer mode is selected when the power supply testing/programming terminal is at a first logic level, the test mode and the EPROM mode are selected when the power supply testing/programming terminal is at a second logic level. The test mode and the EPROM mode are switched by the logic level of the control terminal, and the program voltage is applied at the power supply testing/programming terminal when switched to the EPROM mode.

DESCRIPTION OF THE PREFERRED EMBODIMENT

Figure 1:
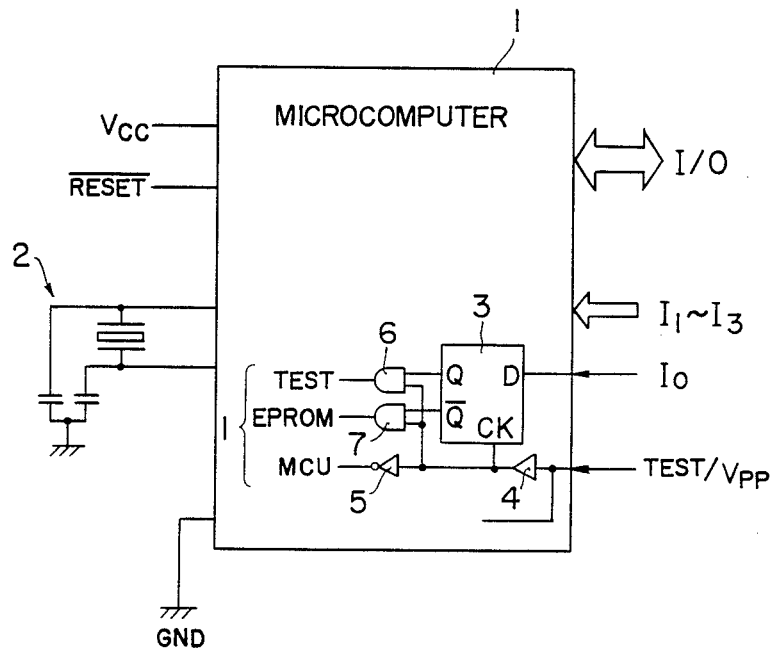
FIG. 1 is a diagram showing a microcomputer according to an embodiment of the present invention.

A microcomputer according to an embodiment of the present invention is shown in FIG. 1. A microcomputer 1 according to the present embodiment incorporates an EPROM, and includes a power supply terminal $V_{cc}$, a reset release terminal RESET, input/output port I/O, input terminals $I_0$, $I_1$, $I_2$, and $I_3$ of control signal ports, and a power supply testing/programming terminal TEST $V_{pp}$ as a mode switching terminal. A quartz oscillator 2 is connected to the microcomputer 1. In the present invention a testing/programming terminal not open to the user can be utilized for mode switching control. The power supply testing/programming terminal TEST/$V_{pp}$ is a mode switching terminal, and functions as both a terminal for testing and a terminal for supplying power in order to program the EPROM.

The input terminal $I_0$ and the power supply testing/programming terminal TEST/$V_{pp}$ are connected to a mode setting circuit provided within the microcomputer 1. That is, the input terminal $I_0$ connected to a data input terminal D of a D-type flip-flop 3. The power supply testing/programming terminal TEST/$V_{pp}$ is connected, via a buffer 4, to a clock input terminal CK of the D-type flip-flop 3, an input terminal of an inverter 5, an input terminal of an AND circuit 6 and an input terminal of an AND circuit 7. Further, an output terminal Q of the D-type flip-flop 3 is connected to the input terminal of the AND circuit 6, and an output terminal $\overline{Q}$ is connected to the input terminal of the AND circuit 7.

An output terminal of the inverter 5 is connected to a terminal MCU which generates a mode signal of level "1" at the microcomputer mode, an output terminal of the AND circuit 6 is connected to a terminal TEST which generates a mode signal of level "1" at the test mode, and an output terminal of the AND circuit 7 is connected to a terminal EPROM which generates a mode signal of level "1" at the EPROM mode, respectively.

Figure 2:
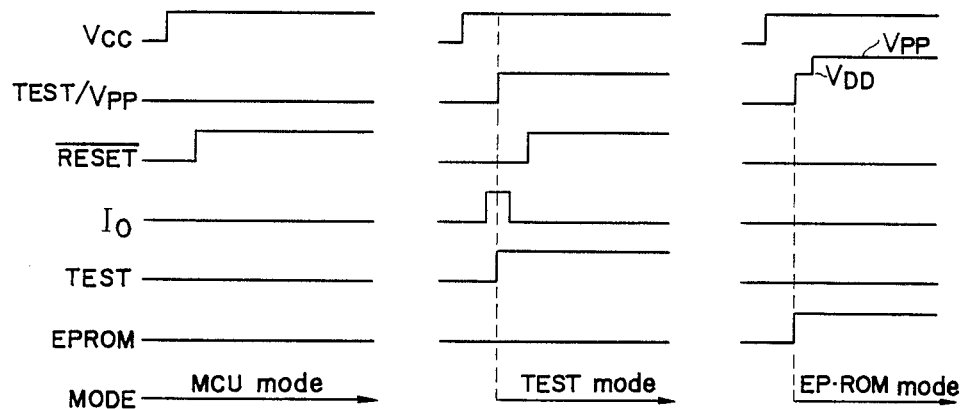
FIG. 2 is a time chart for explaining the operation of the microcomputer shown in FIG. 1.

Next, operation will be explained with reference to FIG. 2. FIG. 2 is a diagram showing signal states of each of the power supply terminal $V_{cc}$, the reset release terminal $\overline{RESET}$, the input terminal $I_0$, the power supply testing/programming terminal $TEST/V_{pp}$, the terminal TEST and the terminal EPROM at each of the microcomputer mode, test mode and EPROM mode, respectively.

In a state in which power supply voltage is input at the power supply terminal $V_{cc}$, and further a reset release signal is input at the reset release terminal $\overline{RESET}$, when both the input terminal $I_0$ and the power supply testing/programming terminal $TEST/V_{pp}$ are at level "0", both the terminal TEST and the terminal EPROM become at level "0", and the terminal MCU becomes at level "1", and the mode at this time is the microcomputer mode. Thus, the microcomputer mode is selected by making the input of the power supply testing/programming terminal $TEST/V_{pp}$ at level "0".

Further, in a state in which the power supply voltage is input at the power supply terminal $V_{cc}$, and a reset release signal is also input at the reset release terminal $\overline{RESET}$, when an input at the power supply testing/programming terminal $TEST/V_{pp}$ is at level "1", and the input terminal $I_0$ is at level "1" at the rise edge of the input at the power supply testing/programming terminal $TEST/V_{pp}$, both the terminal MCU and the terminal EPROM become at level "0" and the terminal TEST becomes at level "1", and the mode at this time is the test mode. Thus, the test mode is selected by making the input at the power supply testing/programming terminal $TEST/V_{pp}$ at level "1", and making the input terminal $I_0$ at level "1" at the rise edge of the input at the power supply testing/programming terminal $TEST/V_{pp}$.

Further, in a state in which power supply voltage is input at the power supply terminal $V_{cc}$, and a reset release signal is also input at the reset release terminal RESET, when an input at the power supply testing/programming terminal $TEST/V_{pp}$ is at level "1", and the input terminal $I_0$ is at level "0" at the rise edge of the input of the power supply testing/programming terminal $TEST/V_{pp}$, both the terminal MCU and the terminal TEST become at level "0" and the terminal EPROM becomes at level "1", and the mode at this time is the EPROM mode. The EPROM mode becomes EPROM/READ mode when the power supply testing/programming terminal $TEST/V_{pp}$ is at level "1", and becomes EPROM/VERIFY, PROGRAM mode by inputting the program voltage at the power supply testing/programming terminal $TEST/V_{pp}$. Thus, the EPROM mode is selected by making the input at the power supply testing/programming terminal $TEST/V_{pp}$ at level "1", and making the input terminal $I_0$ at level "0" at the rise edge of the input at the power supply testing/programming terminal $TEST/V_{pp}$.

Thus, switching between the microcomputer mode, the test mode and the EPROM mode is performed as follows. The microcomputer mode is selected by making the input at the power supply testing/programming terminal $TEST/V_{pp}$ at level "0". By making the input at the power supply testing/programming terminal $TEST/V_{pp}$ at level "1", and further, at the rise edge of the input at the power supply testing/programming terminal $TEST/V_{pp}$, by making the input terminal $I_0$ at level "1", or at level "0", the test mode, or the EPROM mode is selected, respectively.

Thus, in the microcomputer incorporating an EPROM according to the present embodiment, there are advantages that the exclusive terminal for the power supply for program can be omitted, by using the power supply terminal for program for the purpose of writing in and reading from the EPROM in common with the terminal for test, and the omitted one terminal can be used as another terminal.

Further, in the case a pin-compatible microcomputer in which the EPROM incorporated within the microcomputer according to the present invention is replaced by a mask ROM, a test terminal of the microcomputer incorporating the mask ROM may be provided corresponding to the testing/programming terminal of the microcomputer incorporating the EPROM. This test terminal is a terminal for switching the MCU mode and the test mode, and may be considered the same as the testing/programming terminal of the microcomputer incorporating the EPROM, when it is not considered to select the EPROM mode. Hence, in the MCU mode which is usually used by the user, consideration may be made only to make the test terminal of the microcomputer incorporating the mask ROM at level "0", similarly to make the testing/programming terminal of the microcomputer incorporating the EPROM at level "0", and it is not necessary to consider terminals other than the test terminal. Consequently, by using the microcomputer incorporating an EPROM according to the present embodiment, it is possible to exchange into the microcomputer incorporating a mask ROM without changing circuit design.

As described above, according to the present invention, when the user uses the microcomputer as the microcomputer mode, it is possible to design interface with peripheral circuits without restrictions relative to the use of terminals.

What is claimed is:
1. An apparatus comprising:
a microcomputer with at least an MCU terminal, a TEST terminal and an EPROM terminal, said microcomputer capable of operating in at least a microcomputer mode activated by an MCU signal input to said MCU terminal, a test mode activated by a TEST signal input to said TEST terminal and an EPROM mode activated by an EPROM signal input to said EPROM terminal; and power supply testing/programming means for receiving a testing/programming signal and a control signal, and for outputting said MCU, TEST and EPROM signals, said MCU signal indicating said microcomputer mode whenever said control signal is in a first logic level and said testing/programming signal is in a first logic state, said TEST signal indicating said test mode whenever said control signal is in a second logic level and said testing/programming signal is in a second logic state, and said EPROM signal indicating said EPROM mode whenever said control signal is in a first logic state and said testing/programming signal is in a first logic state.

2. An apparatus as claimed in claim 1, wherein said power supply testing/programming means further comprises:
   inverting means for inverting said testing/programming signal and outputting said MCU signal;
   a flip-flop means for receiving said testing/programming signal and said control signal and for generating a positive logic output and a negative logic output corresponding to said control signal;
   first AND gate means for receiving said positive and negative logic outputs and for outputting said TEST signal; and
   second AND gate means for receiving said negative logic output and said testing/programming signal and for outputting said EPROM signal.

3. An apparatus as claimed in claim 1, wherein said power supply testing/programming means receives a voltage for programming said microcomputer while said microcomputer operates in said EPROM mode.

* * * * *